United States Patent
Hu et al.

(10) Patent No.: US 6,806,202 B2
(45) Date of Patent: Oct. 19, 2004

(54) METHOD OF REMOVING SILICON OXIDE FROM A SURFACE OF A SUBSTRATE

(75) Inventors: Xiaoming Hu, Chandler, AZ (US); James B. Craigo, Tempe, AZ (US); Ravindranath Droopad, Chandler, AZ (US); John L. Edwards, Jr., Phoenix, AZ (US); Yong Liang, Gilbert, AZ (US); Yi Wei, Chandler, AZ (US); Zhiyi Yu, Gilbert, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/309,500

(22) Filed: Dec. 3, 2002

(65) Prior Publication Data

US 2004/0106296 A1 Jun. 3, 2004

(51) Int. Cl.[7] .................. H01L 21/461; H01L 21/4763
(52) U.S. Cl. .................. 438/722; 438/624; 438/627; 438/679; 438/680; 438/775; 438/723; 438/765
(58) Field of Search ............... 438/723, 722, 438/765, 299, 204, 287, 404, 624, 627, 643, 653, 660, 679, 680, 775

(56) References Cited

U.S. PATENT DOCUMENTS

| | | |
|---|---|---|
| 3,617,951 A | 11/1971 | Anderson |
| 4,177,094 A | 12/1979 | Kroon |
| 4,695,120 A | 9/1987 | Holder |
| 4,801,184 A | 1/1989 | Revelli |
| 4,804,866 A | 2/1989 | Akiyama |
| 4,866,489 A | 9/1989 | Yokogawa et al. |
| 5,028,563 A | 7/1991 | Feit et al. |
| 5,057,694 A | 10/1991 | Idaka et al. |
| 5,087,829 A | 2/1992 | Ishibashi et al. |
| 5,140,387 A | 8/1992 | Okazaki et al. |
| 5,148,504 A | 9/1992 | Levi et al. |
| 5,216,359 A | 6/1993 | Makki et al. |
| 5,262,659 A | 11/1993 | Grudkowski et al. |
| 5,268,327 A | 12/1993 | Vernon |
| 5,362,972 A | 11/1994 | Yazawa et al. |
| 5,371,621 A | 12/1994 | Stevens |
| 5,410,622 A | 4/1995 | Okada et al. |
| 5,446,719 A | 8/1995 | Yoshida et al. |

(List continued on next page.)

FOREIGN PATENT DOCUMENTS

| | | |
|---|---|---|
| EP | 0 331 338 | 9/1989 |
| EP | 0 412 002 | 2/1991 |
| EP | 0 600 658 | 6/1994 |

(List continued on next page.)

OTHER PUBLICATIONS

Charles Kittel; "Introduction to Solid State Physics"; John Wiley & Sons, Inc. Fifth Edition; pp. 415.

Chyuan–Wei Chen et al; "Liquid–phase epitaxial growth and characterization of InGaAsP layers grown on GaAsP substrates for application to orange light–emitting diodes"; 931 Journal of Applied Physics; 77 Jan. 15, 1995, No. 2; Woodbury, NY, US; pp. 905–909.

W. Zhu et al.; "Oriented diamond films grown on nickel substrates"; 320 Applied Physics Letters; 63(1993) Sep., No. 12, Woodbury, NY, US; pp. 1640–1642.

(List continued on next page.)

*Primary Examiner*—Matthew Smith
*Assistant Examiner*—Igwe U. Anya
(74) *Attorney, Agent, or Firm*—Oblon, Spivak, McClelland, Maier & Neustadt, P.C.

(57) ABSTRACT

A method for removing silicon oxide from a surface of a substrate is disclosed. The method includes depositing material onto the silicon oxide (110) and heating the substrate surface to a sufficient temperature to form volatile compounds including the silicon oxide and the deposited material (120). The method also includes heating the surface to a sufficient temperature to remove any remaining deposited material (130).

3 Claims, 1 Drawing Sheet

U.S. PATENT DOCUMENTS

| | | | |
|---|---|---|---|
| 5,477,363 A | 12/1995 | Matsuda | |
| 5,508,554 A | 4/1996 | Takatani et al. | |
| 5,510,665 A | 4/1996 | Conley | |
| 5,528,209 A | 6/1996 | Macdonald et al. | |
| 5,559,368 A | 9/1996 | Hu et al. | |
| 5,570,226 A | 10/1996 | Ota | |
| 5,574,296 A | 11/1996 | Park et al. | |
| 5,574,589 A | 11/1996 | Feuer et al. | |
| 5,578,162 A | 11/1996 | D'Asaro et al. | |
| 5,585,167 A | 12/1996 | Satoh et al. | |
| 5,585,288 A | 12/1996 | Davis et al. | |
| 5,635,453 A | 6/1997 | Pique et al. | |
| 5,666,376 A | 9/1997 | Cheng | |
| 5,674,813 A | 10/1997 | Nakamura et al. | |
| 5,679,947 A | 10/1997 | Doi et al. | |
| 5,684,302 A | 11/1997 | Wersing et al. | |
| 5,693,140 A | 12/1997 | McKee et al. | |
| 5,719,417 A | 2/1998 | Roeder et al. | |
| 5,772,758 A | 6/1998 | Collins et al. | |
| 5,831,960 A | 11/1998 | Jiang et al. | |
| 5,838,053 A | 11/1998 | Bevan et al. | |
| 5,864,171 A | 1/1999 | Yamamoto et al. | |
| 5,878,175 A | 3/1999 | Sonoda et al. | |
| 5,882,948 A | 3/1999 | Jewell | |
| 5,905,571 A | 5/1999 | Butler et al. | |
| 5,937,115 A | 8/1999 | Domash | |
| 5,959,308 A | 9/1999 | Shichijo et al. | |
| 5,976,953 A | 11/1999 | Zavracky et al. | |
| 5,987,196 A | 11/1999 | Noble | |
| 5,998,781 A | 12/1999 | Vawter et al. | |
| 5,998,819 A | 12/1999 | Yokoyama et al. | |
| 6,049,110 A | 4/2000 | Koh | |
| 6,064,783 A | 5/2000 | Congdon et al. | |
| 6,080,378 A | 6/2000 | Yokota et al. | |
| 6,110,813 A | 8/2000 | Ota et al. | |
| 6,113,225 A | 9/2000 | Miyata et al. | |
| 6,198,119 B1 | 3/2001 | Nabatame et al. | |
| 6,239,012 B1 | 5/2001 | Kinsman | |
| 6,297,598 B1 | 10/2001 | Wang et al. | |
| 6,307,996 B1 | 10/2001 | Nashimoto et al. | |
| 6,376,337 B1 | 4/2002 | Wang et al. | |
| 6,392,253 B1 | 5/2002 | Saxena | |
| 6,452,232 B1 | 9/2002 | Adan | |
| 6,477,285 B1 | 11/2002 | Shanley | |
| 6,496,469 B1 | 12/2002 | Uchizaki | |
| 6,504,189 B1 | 1/2003 | Matsuda et al. | |
| 6,528,374 B2 * | 3/2003 | Bojarczuk, Jr. et al. | 438/229 |
| 6,589,887 B1 * | 7/2003 | Dalton et al. | 438/765 |
| 2001/0020278 A1 | 9/2001 | Saito | |
| 2001/0036142 A1 | 11/2001 | Kadowaki et al. | |
| 2002/0079576 A1 | 6/2002 | Seshan | |
| 2002/0140012 A1 | 10/2002 | Droopad | |
| 2002/0145168 A1 | 10/2002 | Bojarczuk, Jr. et al. | |
| 2002/0195610 A1 | 12/2002 | Kiosowiak | |

FOREIGN PATENT DOCUMENTS

| | | |
|---|---|---|
| EP | 0 614 256 | 9/1994 |
| EP | 0 619 283 | 10/1994 |
| EP | 0 661 561 | 7/1995 |
| EP | 0 860 913 | 8/1995 |
| EP | 0 852 416 | 7/1998 |
| EP | 1 035 759 | 9/2000 |
| EP | 1 054 442 | 11/2000 |
| EP | 1 089 338 | 4/2001 |
| JP | 62-245205 | 10/1987 |
| JP | 01-196809 | 8/1989 |
| JP | 03-149882 | 11/1989 |
| JP | 3-171617 | 7/1991 |
| JP | 05 221800 | 8/1993 |
| JP | 5-232307 | 9/1993 |
| JP | 5-243525 | 9/1993 |
| JP | 01 294594 | 11/1999 |
| JP | 2000-349278 | 12/2000 |
| WO | WO 01/59837 | 8/2001 |
| WO | WO 02/08806 | 1/2002 |

OTHER PUBLICATIONS

M. Schreck et al.; "Diamond/Ir/SrTi03: A material combination for improved heteroepitaxial diamond films"; Applied Physics Letters; vol. 74, No. 5; Feb. 1, 1999; pp. 650–652.

Yoshihiro Yokota et al.; "Cathodoluminescence of boron–doped heteroepitaxial diamond films on platinum"; Diamond and Related Materals 8 (1999); pp. 1587–1591.

J.R. Busch et al.; "Linear Electro–Optic Response In Sol–Gel Pzt Planar Waveguide"; Electronics Letters; Aug. 13th, 1992, vol. 28, No. 17; pp. 1591–1592.

R. Droopad et al; "Epitaxial Oxide Films on Silicon: Growth, Modeling and Device Properties"; Mat. Res. Soc. Symp. Proc. vol. 619; 2000 Materials Research Society; pp. 155–165.

H. Ohkubo et al.; "Fabrication of High Quality Perovskite Oxide Films by Lateral Epitaxy Verified with RHEED Oscillation"; 2419A Int. Conf. on Solid State Device & Materials, Tsukuba, Aug. 26–28, 1992; pp. 457–459.

Lin–Li; "Ferroelectric/Superconductor Heterostructures"; Materials Science and Engineering; 29 (2000) pp. 153–181.

L. Fan et al.; "Dynaamic Beam Switching of Vertical–Cavity Surface–Emitting Lasers with Integrated Optical Beam Routers"; IEEE Photonics Technolgy Letters; vol. 9, No. 4; Apr. 4, 1997, pp. 505–507.

Y. Q. Xu. et al.; "(Mn. Sb) dropped–Pb (Zr,.Ti)03 infared detector arrays"; Journal of Applied Physics; vol. 88, No. 2; Jul. 15, 2000; pp. 1004–1007.

Kiyoko Kato et al.: "Reduction of dislocations in InGaAs layer on GaAs using epitaxial ateral overgrowth"; 2300 Journal of Crystal Growth 115 (1991) pp. 174–179; Dec. 1991.

Fan et al., "Metal–adsorbate–induced Si(111)–!1×3) reconstruction", The America Physical Society. Feb. 15, 1990, pp. 3592–3595.

Sekiguchi, "A series of Ca–induced reconstruction on Si(111) surface", Surface Science 493 (2001), pp. 148–156.

Kawashima, "Surface structures of the Mg/Si(100) system studied by low–energy electron diffraction and Auger electron spectroscopy", Surface Sccience 319 (1994), pp. 165–171.

* cited by examiner

METHOD OF REMOVING SILICON OXIDE FROM A SURFACE OF A SUBSTRATE

FIELD OF THE INVENTION

This invention relates generally to semiconductor structures and devices and to a method for their fabrication, and more specifically to methods of removing silicon oxide from a surface of a substrate.

BACKGROUND OF THE INVENTION

Semiconductor materials such as silicon typically form a native oxide when exposed to an oxygen containing environment such as ambient air. Often, it is desirable to remove the silicon oxide from a surface of a semiconductor surface before depositing or growing layers on the surface during the manufacture of semiconductor devices. By way of particular example, native oxides are desirably removed from a surface of a silicon wafer prior to growing epitaxial layers on the silicon wafer.

Typical silicon oxide removal processes include wet or dry etches, such as hydrofluoric or buffered hydrofluoric etch processes, or high temperature heating of the surface (e.g., heating the silicon surface to more than 1000° C.). While methods including hydrofluoric or high-temperature techniques are suitable for removing silicon oxide in some instances, such processes may be undesirable for some applications. In particular, hydrofluoric etch processes are generally undesirable when an oxide-free surface is desired for subsequent epitaxial growth or deposition of material on the oxide-free surface, because, in part, hydrofluoric etch processes often result in damaged and/or disordered silicon surfaces. In this case, the surface must be exposed to an anneal process, typically having a temperature greater than about 1000° C. Similarly, high-temperature oxide removal processes are generally undesirable after the semiconductor wafer has undergone other processing such as diffusion, implantation, or material deposition, because the requisite high temperature may cause unwanted diffusion of materials within the semiconductor structures. In addition, heating wafers, particularly wafers having a diameter of about 200 mm or more, to a temperature of about 1000° C. is relatively difficult and will create a lot of undesired stress in the wafers. Although it is also possible to use thermal de-oxidation at a relatively low temperature of about 900° C., complete removal of SiOx from surface is very difficult and requires a long time cycle. Accordingly, improved methods for removing silicon oxide from a surface of a semiconductor are desired.

BRIEF DESCRIPTION OF THE DRAWINGS

The present invention is illustrated by way of example and not limitation in the accompanying figures, in which like references indicate similar elements, and in which.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION OF THE DRAWINGS

The present invention provides a method for removing silicon oxide ($SiO_x$) from a surface of a semiconductor wafer. As described in more detail below, the process is a dry process, which is suitable for use with growing epitaxial layers of material on the semiconductor surface.

Figure 1:
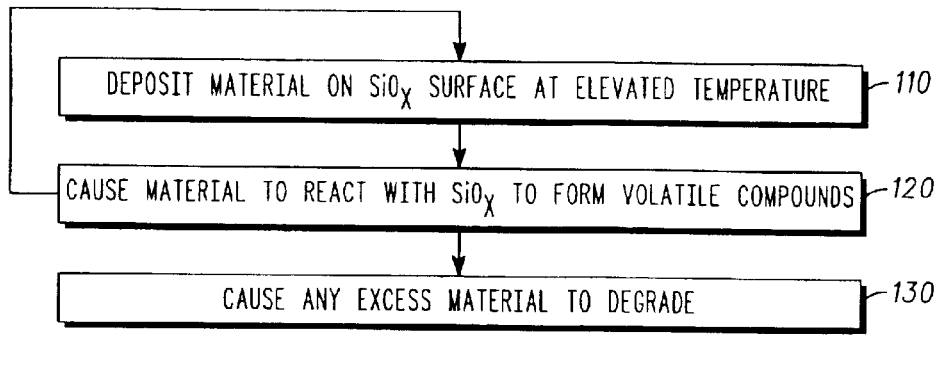
FIG. 1 illustrates a process for removing silicon oxide from a surface of a substrate in accordance with the present invention.

FIG. 1 illustrates a process 100 in accordance with one exemplary embodiment of the invention. Process 100 includes a material deposition step (step 110), a volatile compound formation step (step 120), and a material removal step (step 130). As illustrated, steps 110 and 120 may be repeated multiple times until substantially all $SiO_x$ is removed from the substrate surface.

Figure 2:
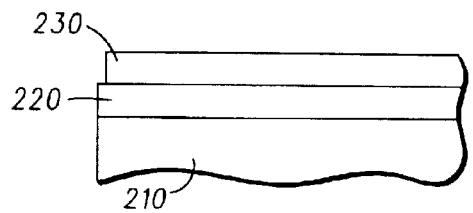
FIG. 2 illustrates a structure including silicon oxide and a material that facilitates silicon oxide removal from the structure.

FIG. 2 illustrates a semiconductor structure 200, including a substrate 210 and a $SiO_x$ layer to be removed using process 100. Substrate 210, in accordance with an embodiment of the invention, is a monocrystalline semiconductor or compound semiconductor wafer, preferably of large diameter. The wafer can be of, for example, a material from Group IV of the periodic table. Examples of Group IV semiconductor materials include silicon, germanium, mixed silicon and germanium, mixed silicon and carbon, mixed silicon, germanium and carbon, and the like. Preferably, substrate 210 is a wafer containing silicon or germanium, and most preferably is a high quality monocrystalline silicon wafer as used in the semiconductor industry. The substrate may also include one or more layers of conductive, insulating, or semi-conductive materials as are commonly used in semiconductor device manufacturing. Substrate 210 may also include portions including defused or implanted materials.

$SiO_x$ layer 220 may be a deposited film (or a portion thereof remaining after an etch process) or a native oxide. The thickness of layer 220 may depend on a variety of factors, but in the case of native silicon oxide films overlying a silicon substrate, the thickness of layer 220 is generally about 1 nm to about 3 nm.

Referring now to FIGS. 1 and 2, in accordance with one embodiment of the invention, $SiO_x$ layer 220 is removed by initially depositing a layer of material 230 (e.g., a few monolayers to about 2 nm) on $SiO_x$ layer 220. Material layer 230 includes material that reacts with $SiO_x$ to form volatile compounds (typically at elevated temperatures), does not readily form stable suicides that would remain on the substrate surface is relatively non-toxic, is relatively easy to handle, and is relatively inexpensive. In addition, material suitable for use with layer 230 preferably desorbs from substrate 210 materials at a temperature less than about 900° C., so that any remaining material 230 can be removed during step 130 without causing damage to substrate 210 or any unwanted diffusion of materials deposited onto or distributed within substrate 210. Material 230 is also preferably non-oxidizable in air. However, if material 230 does readily oxidize in air, it may be protected by a film of protective material such as oxide or nitride, which can be easily removed subsequent to further processing.

Material 230 may be deposited using any suitable means. For example, material 230 can be deposited using physical vapor deposition (PVD) techniques such as sputtering or evaporating the material onto the surface of the $SiO_x$. The material deposition process can also be carried out by the process of chemical vapor deposition (CVD), metal organic chemical vapor deposition (MOCVD), migration enhanced epitaxy (MEE), atomic layer epitaxy (ALE), chemical solution deposition (CSD), pulsed laser deposition (PLD), or the like.

Exemplary materials suitable for material layer 230 include lithium (Li), magnesium (Mg), and calcium (Ca). Of these materials, Mg and Ca are preferred because they can be removed from a silicon surface during step 130 at relatively low temperatures, about 370° C. and 800° C., respectively, whereas Li requires a relatively high temperature, greater than about 800° C.

In accordance with one embodiment of the invention, step 110 includes depositing only a few monolayers (e.g., about 1 to about 10 monolayers) of material for layer 230 and is performed at an elevated temperature, e.g., about 200° C. to about 600° C. In this case, volatile compounds are formed as material for layer 230 is deposited. Thus, after an initial deposition of material layer 230, both deposition step 110 and volatile compound formation step 120 occur simultaneously.

Figure 3:
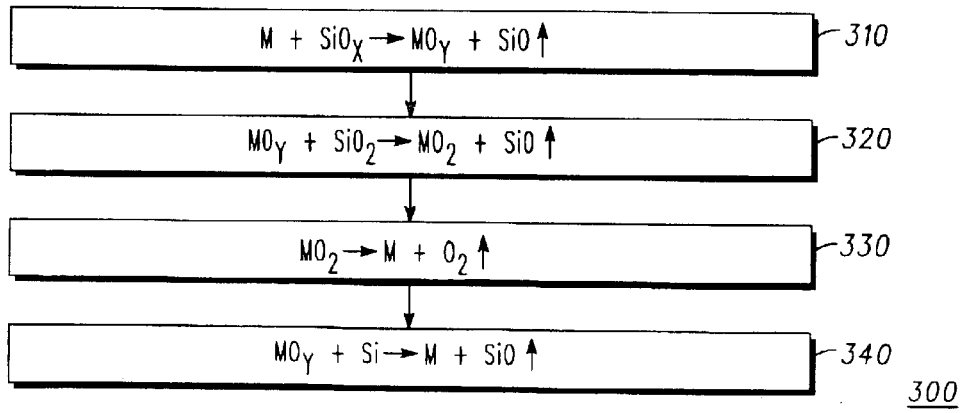
FIG. 3 illustrates exemplary chemical reactions for removing silicon oxide from a surface of a substrate.

FIG. 3 illustrates an exemplary volatile compound formation process 300 thought to occur during step 120, when step 110 includes material deposition at an elevated temperature. As illustrated, process 300 includes steps 310–340.

Process 300 begins with heating $SiO_x$ layer 220 and material layer 230 to a temperature of greater than about 600° C. and less than about 900° C. to convert material layer 230 and the silicon oxide to $MO_y$ and volatile SiO (step 310). As noted above, this step may be performed simultaneously with step 110. Next, the $MO_y$ reacts with silicon oxide to form $MO_2$ and volatile SiO (step 320) at a temperature of about 600° C. and less than about 900° C. The $MO_2$ then decomposes into M and $O_2$ at a temperature of at least about 25° C. for lithium, about 100° C. for magnesium, or about 200° C. for calcium. and in any event less than about 900° C. (step 330). Finally, the $MO_x$ reacts with Si to form M and volatile SiO at a temperature of about 600° C. to less than about 900° C. to form an oxide-free silicon surface (step 340). Steps 110 and 310–340 are repeated until substantially all $SiO_x$ is removed from the silicon surface.

Any remaining material of layer 230 on the surface of substrate 210 is removed by heating the surface to a temperature of about 370° C. to less than about 900° C. in the case of magnesium or about 800° C. to less than about 900° C. in the case of calcium. In any case, the remaining material is removed, providing an ordered, e.g., 2x1 ordered silicon surface, for subsequent processing.

In accordance with another embodiment of the invention, process 100 includes depositing material onto a substrate surface as described above and heating the substrate surface to a temperature of about 500° C. to less than about 900° C. to form and desorb MO compounds (step 120). In accordance with one aspect of this embodiment of the invention, only one deposition step 110 is performed, e.g., at a temperature of about 700° C. and the amount of material deposited during step 110 depends on an amount of $SiO_x$ to be removed and generally is between about 10 monolayers to about 20 monolayers of material. By way of particular example, for an oxide thickness of about 30 Å, about 18 monolayers of material is deposited onto $SiO_x$ layer 220 during step 110. This type of oxide removal is often referred to as flux cleaning.

To facilitate removal of volatile compounds, steps 120 and 130 are carried out under a vacuum condition. By way of particular example, steps 120 and 130 are performed at pressure of about $10^{-9}$ to about $10^{-10}$ torr. In addition, to mitigate unwanted contamination and/or oxide growth, steps 120 and 130 are preferable carried out in the same reactor used for subsequent processing—e.g., a MBE reactor used to grow a subsequent epitaxial material layer.

Because process 100 is performed at relatively low temperatures (less than about 900° C.), process 100 is relatively non-destructive to the surface of substrate 210, so subsequent annealing, which is typically required for HF based $SiO_x$ removal processes, is generally not required to practice the present invention. In addition, problems associated with heating wafers to temperatures greater than about 900° C. are avoided.

Figure 4:
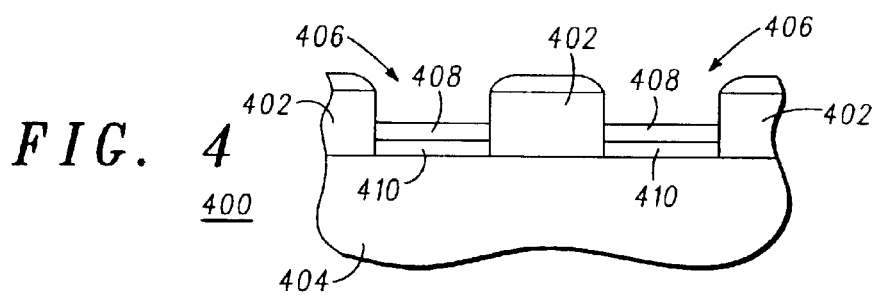
FIG. 4 illustrates a structure including a mask, silicon oxide, and a material that facilitates silicon oxide removal from the structure.

In accordance with another embodiment of the invention, silicon oxide is selectively removed from a portion of a substrate surface using a suitable mask. In this case, as illustrated in FIG. 4, a mask 402 (e.g., a relatively thick layer of silicon oxide or silicon nitride) is deposited onto a surface of a substrate 404 and patterned to create openings 406. Material is then deposited over silicon oxide regions 410 to form material layers 408 in regions 406. Structure 400 is then processed through steps 120–130 as described above. Other techniques for patterning regions of a substrate surface to selectively remove silicon oxide are also considered to be within the scope of this invention.

It is understood that precise measurement of actual temperatures in MBE equipment, as well as other processing equipment, is difficult, and is commonly accomplished by the use of a pyrometer or by means of a thermocouple placed in close proximity to the substrate. Calibrations can be performed to correlate the pyrometer temperature reading to that of the thermocouple. However, neither temperature reading is necessarily a precise indication of actual substrate temperature. Furthermore, variations may exist when measuring temperatures from one MBE system to another MBE system. For the purpose of this description, typical pyrometer temperatures will be used, and it should be understood that variations may exist in practice due to these measurement difficulties.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential features or elements of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

We claim:

1. A method of removing silicon oxide from a substrate surface, the method comprising:

providing a substrate having a surface comprising silicon oxide;

depositing about 1 monolayer to about 10 monolayers of a material comprising an element selected from the group consisting of lithium, calcium, and magnesium;

heating the substrate surface to a first temperature less than about 600° C. to form a volatile compound comprising oxides and the material; and heating the substrate surface to a second temperature less than about 900° C. to remove any remaining material from the substrate surface, wherein the step of depositing and the step of heating the substrate to a first temperature are repeated until substantially all the silicon oxide is removed from the substrate surface.

2. The method of claim 1 wherein the step of depositing comprises depositing magnesium and the step of heating the substrate surface to a second temperature comprises heating the surface to a temperature of about 370° C. to about 900° C.

3. The method of claim 1 wherein the step of depositing comprises depositing calcium and the step of heating the substrate surface to a second temperature comprises heating the surface to a temperature of about 800° C. to about 900° C.

* * * * *